(12) United States Patent
Hao

(10) Patent No.: US 11,313,887 B2
(45) Date of Patent: Apr. 26, 2022

(54) SYSTEMS AND METHODS FOR DETERMINING LOAD DIRECTION UNDER ADVERSE ENVIRONMENTAL CONDITIONS

(71) Applicant: Schweitzer Engineering Laboratories, Inc., Pullman, WA (US)

(72) Inventor: Kei Hao, Anaheim, CA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 193 days.

(21) Appl. No.: 16/727,324

(22) Filed: Dec. 26, 2019

(65) Prior Publication Data

US 2021/0109137 A1 Apr. 15, 2021

Related U.S. Application Data

(60) Provisional application No. 62/914,331, filed on Oct. 11, 2019.

(51) Int. Cl.
*G01R 19/25* (2006.01)
*G01R 19/14* (2006.01)

(52) U.S. Cl.
CPC ......... *G01R 19/2513* (2013.01); *G01R 19/14* (2013.01)

(58) Field of Classification Search
CPC .............................. G01R 19/2513; G01R 19/14
See application file for complete search history.

(56) References Cited

U.S. PATENT DOCUMENTS

| 5,796,259 A * | 8/1998 | Dickmander .......... G01R 31/08 324/108 |
| 5,818,241 A * | 10/1998 | Kelly ..................... G01N 33/24 324/643 |
| 9,250,282 B2 | 2/2016 | Ukil et al. |
| 9,366,715 B2 | 6/2016 | Ukil et al. |
| 2003/0099070 A1 | 5/2003 | Macbeth |
| 2007/0226602 A1 | 9/2007 | Kirmser |
| 2013/0141827 A1 | 6/2013 | Ukil et al. |
| 2013/0221977 A1 | 8/2013 | Ukil et al. |

(Continued)

OTHER PUBLICATIONS

IntelliCap® 2000 Automatic Capacitor Control Instruction Sheet 1024-540, S&C Electric Company, Aug. 2019.

(Continued)

*Primary Examiner* — Daniel C Puentes
(74) *Attorney, Agent, or Firm* — Fletcher Yoder, P.C.; Richard M. Edge; Bradley W. Schield

(57) ABSTRACT

Systems and methods for calculating load direction even under adverse environmental conditions are provided. A system may include sensing circuitry and processing circuitry. The sensing circuitry may sense a first parameter and a second parameter of the electrical waveform on the transmission line of the electric power distribution system. The processing circuitry may determine a present load direction of an electrical waveform using a first method based at least in part on the first parameter in response to detecting that the sensing circuitry is experiencing a first environmental condition. The processing circuitry may determine the present load direction of the electrical waveform using a second method based at least in part on the second parameter and not the first parameter in response to detecting that the sensing circuitry is experiencing a second environmental condition.

10 Claims, 5 Drawing Sheets

(56) References Cited

U.S. PATENT DOCUMENTS

| | | |
|---|---|---|
| 2014/0200843 A1 | 7/2014 | Shamir |
| 2015/0293164 A1 | 10/2015 | Stephenson |
| 2015/0309105 A1 | 10/2015 | Ostrovsky |
| 2016/0187409 A1 | 6/2016 | Kolker |
| 2016/0187410 A1 | 6/2016 | Kolker |
| 2016/0202321 A1 | 7/2016 | Drame |
| 2016/0245850 A1 | 8/2016 | Kasztenny |
| 2018/0292447 A1 | 10/2018 | Piyasinghe |
| 2019/0037515 A1 | 1/2019 | Shamir |
| 2019/0123668 A1 | 4/2019 | Da Costa |
| 2019/0331722 A1* | 10/2019 | Hao .................. G01R 19/2513 |

OTHER PUBLICATIONS

Ukil, Abhisek, et al., "Current-Only Directional Overcurrent Relay". IEEE Sensors Journal, Nov. 22, 2010, vol. 11, Issue 6.

Ukil, Abhisek, et al., "Current-Only Directional Overcurrent Protection for Distribution Automation: Challenges and Solutions". IEEE Transactions on Smart Grid, Aug. 22, 2012, vol. 3, Issue 4.

* cited by examiner

SYSTEMS AND METHODS FOR DETERMINING LOAD DIRECTION UNDER ADVERSE ENVIRONMENTAL CONDITIONS

CROSS REFERENCE TO RELATED APPLICATIONS

This application claims priority from and benefit of U.S. Provisional Application Ser. No. 62/914,331, filed Oct. 11, 2019, entitled "SYSTEMS AND METHODS FOR DETERMINING LOAD DIRECTION UNDER ADVERSE ENVIRONMENTAL CONDITIONS," which is hereby incorporated by reference in its entirety for all purposes.

BACKGROUND

This disclosure relates to determining load direction when certain electrical measurements are affected by present environmental conditions, such as under excessive moisture.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electric power distribution systems carry electricity from a transmission system to residential communities, factories, industrial areas, and other electricity consumers. To monitor power distribution, electrical measurement devices on the electric power distribution system may use electrical sensors to obtain electrical measurements that may be used to determine a load direction. Load direction refers to the direction that power is flowing on a power line. For example, power may flow from a generator that generates electricity to a load, such as an electrical motor, building, or factory that consumes the electricity. Utilities desire to know the load direction in every part of a distribution system to provide better load balancing and planning, and to improve power quality and efficiency in general. A present awareness of load direction can also be used to estimate a fault location in the event of a fault. Yet some environmental conditions, such as inclement weather or high humidity, may cause electrical sensors on some electrical measurement devices to produce erroneous measurements that, when used to calculate load direction, may erroneously misidentify the present load direction.

SUMMARY

Certain examples commensurate in scope with the originally claimed subject matter are discussed below. These examples are not intended to limit the scope of the disclosure. Indeed, the present disclosure may encompass a variety of forms that may be similar to or different from the examples set forth below.

In one example, a system for calculating a present load direction of an electrical waveform on a transmission line of an electric power distribution system may include sensing circuitry and processing circuitry. The sensing circuitry may sense a first parameter and a second parameter of the electrical waveform on the transmission line of the electric power distribution system. The processing circuitry may determine the present load direction of the electrical waveform using a first method based at least in part on the first parameter in response to detecting that the sensing circuitry is experiencing a first environmental condition. The processing circuitry may determine the present load direction of the electrical waveform using a second method based at least in part on the second parameter and not the first parameter in response to detecting that the sensing circuitry is experiencing a second environmental condition.

In another example, an electronic device includes a housing that includes a coupling configured to attach to a power line, sensing circuitry, and processing circuitry. The sensing circuitry may obtain voltage measurements and current measurements of an electrical waveform on the power line. The processing circuitry may determine, based at least in part on the voltage measurements, to operate in a first mode to determine a load direction or to operate in a second mode to determine the load direction. In the first mode, the processing circuitry may determine the load direction using the voltage measurements. In the second mode, the processing circuitry may determine the load direction without using the voltage measurements.

In another example, one or more tangible, non-transitory, computer-readable media having stored thereon instructions, that when executed, cause a processor to receive voltage measurements and current measurements of an electrical waveform on a transmission line of a power distribution system. The instructions may cause the processor to use the current measurements to compute an average period and average frequency, compute a present voltage period using the voltage measurements, compute a present current period using the current measurements, determine a first relationship between the present voltage period and the average period or the present voltage period and the present current period, or both, and determine, based at least in part on the first relationship, to operate in a first mode to determine a load direction on the transmission line or to operate in a second mode to determine the load direction. When operating in the first mode, the load direction may be determined using the voltage measurements. When operating in the second mode, the load direction may be determined without using the voltage measurements.

DETAILED DESCRIPTION

Figure 1:
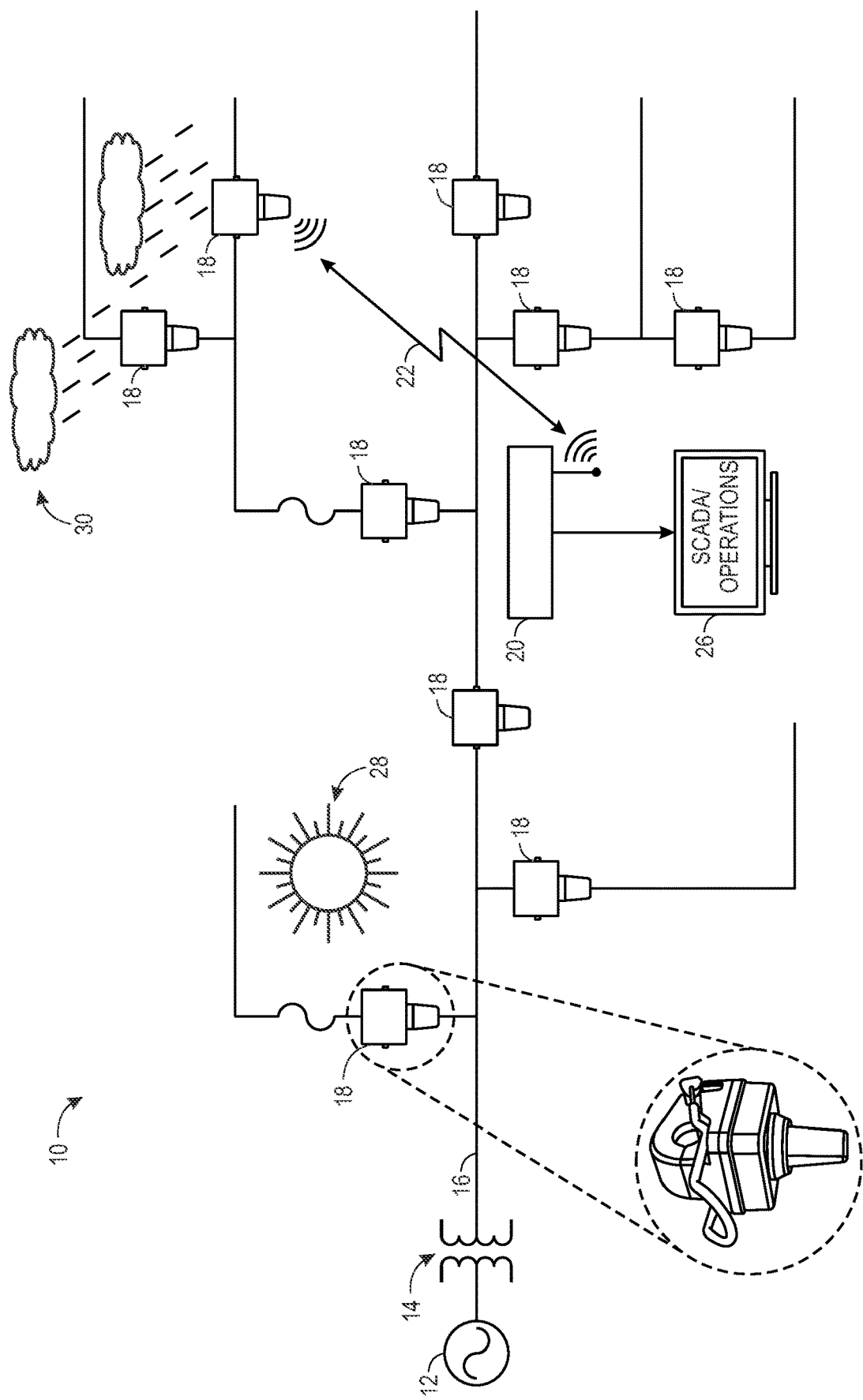
FIG. 1 is a schematic diagram of an electric power distribution system with wireless line sensors disposed in various locations, some of which may experience adverse environmental conditions, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Moreover, the embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. In some cases, well-known features, structures or operations are not shown or described in detail. Furthermore, the described features, structures, or operations may be combined in any suitable manner in one or more embodiments. The components of the embodiments as generally described and illustrated in the figures could be arranged and designed in a wide variety of different configurations.

In addition, several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular data type.

In certain embodiments, a particular software module or component may include disparate instructions stored in different locations of a memory device, which together implement the described functionality of the module. Indeed, a module or component may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Thus, embodiments may be provided as a computer program product including a tangible, non-transitory, computer-readable and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), magnetic or optical cards, solid-state memory devices, or other types of machine-readable media suitable for storing electronic and/or processor executable instructions.

As mentioned above, electric power distribution systems carry electricity from a transmission system to residential communities, factories, industrial areas, and other electricity consumers. To monitor power distribution, electrical measurement devices on the electric power distribution system may use electrical sensors to obtain electrical measurements that may be used to determine a load direction. Load direction refers to the direction that power is flowing on a power line. For example, power may flow from a generator that generates electricity to a load, such as an electrical motor, building, or factory that consumes the electricity. Utilities desire to know the load direction in every part of a distribution system to provide better load balancing and planning, and to improve power quality and efficiency in general. A present awareness of load direction can also be used to estimate a fault location in the event of a fault.

To maintain a present awareness of load direction, even under environmental conditions such as inclement weather or high humidity, load direction may be determined using at least two different methods. The first method may identify a present load direction under first environmental conditions (e.g., non-high-moisture conditions). A second method may identify a load direction change, but not an absolute load direction, under second environmental conditions (e.g., high-moisture conditions that could produce erroneous results using the first method).

Embodiments of the present disclosure operate to calculate load direction in power harvesting wireless line sensors in high moisture conditions. As used in this disclosure, a "load" may refer to an object that consumes electricity. A "fault" may refer to any abnormal current proceeding through any specified portion of a circuit. A fault could be characterized as a "short circuit" if a current value exceeds a certain value or an "open circuit" if a current value decreases to a certain value (usually zero). Furthermore, a "zero crossing" may refer to a point in a measurement versus time where the measurement has a value of zero. For alternating current (AC) power, measurements of voltage or current usually have periodic zero crossings.

FIG. 1 is a schematic diagram of an electric power distribution system 10. The electric power distribution system 10 may receive electric power from a variety of generators. For example, electric power is shown in FIG. 1 as generated by a generator 12. A transformer 14 may step up or step down voltage from the generator 12 as specified for transmission through a distribution line 16. Dispersed at various locations throughout distribution lines of the electric power distribution system 10 are wireless line sensors 18. The wireless line sensors 18 may be able to obtain certain electrical measurements at the various locations. For example, the wireless line sensors 18 may measure electrical current and/or voltage. The wireless line sensors 18 may wirelessly transmit these measurements information to a wireless line sensor collector 20 via a wireless (e.g., radio or optical) signal 22. The wireless line sensor collector 20 may also communicate via wired or wireless communication 24 with an Outage Management System (OMS) or Supervisory Control and Data Acquisition (SCADA) system 26.

The wireless line sensors 18, the wireless line sensor collector 20, and/or the Outage Management System (OMS) or Supervisory Control and Data Acquisition (SCADA) system 26 may use the electrical measurements obtained by the wireless line sensors 18 to determine a load direction at each wireless line sensor 18. Indeed, in some cases, this may be computed individually by each wireless line sensor 18. The wireless line sensors 18 may also include indicator lights (e.g., light emitting diodes (LEDs)) that indicate the last load direction that was determined. The indicator lights may remain visible after a fault to enable an operator to perform a search for a fault location. When a fault occurs, one wireless line sensor 18 or a group of wireless line sensors 18 may detect the fault, determine the fault direction, display the load and/or fault current directions on indicator lights, and send the load and fault directions and fault current quantity to the wireless line sensor collector 20.

The wireless line sensors 18 may experience a variety of environmental conditions. For instance, some wireless line sensors 18 may experience heat due to exposure to sun 28. Other wireless line sensors 18 may experience high moisture due, for example, to rain 30 or particularly high humidity. It is believed that certain high-moisture events, such as rain or high-humidity climates, may alter certain electrical measurements. For example, excess moisture could alter the value of a dielectric of a capacitor used to measure voltage. The wireless line sensors 18, the wireless line sensor collector 20, and/or the Outage Management System (OMS) or Supervisory Control and Data Acquisition (SCADA) system 26 may thus use different methods for determining load direction depending on the environmental conditions presently affecting a particular wireless line sensor 18. Indeed, as will be discussed further below, load direction may be determined using at least two different methods. The first method may identify a present load direction under first environmental conditions (e.g., non-high-moisture conditions). A second method may identify a load direction change, but not an absolute load direction, under second environmental conditions (e.g., high-moisture conditions that could produce erroneous results using the first method).

Figure 2:
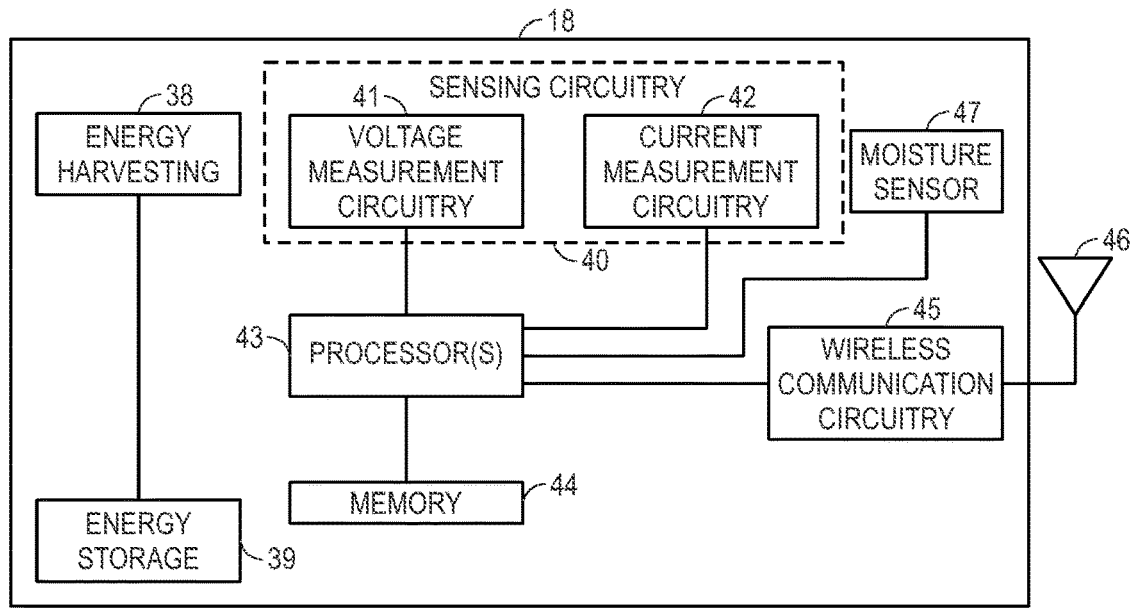
FIG. 2 is a block diagram illustrating various components that may be included in a wireless line sensor, in accordance with an embodiment.

FIG. 2 is a block diagram of a wireless line sensor 18. The wireless line sensor 18 may obtain power to operate using energy harvesting circuitry 38. The energy harvesting circuitry 38 may harvest energy from the distribution line where it is located. Most power lines are not enclosed, so a wireless line sensor 18 may be attached or clamped to a power line via any suitable coupling. The wireless line sensor 18 may syphon a small amount of current using an inductive coil. The wireless lines sensor 18 may store the energy it has harvested using any suitable energy storage 39. The energy storage 39 may include, for example, a capacitor, a supercapacitor, a battery, a flywheel, or any other suitable form of storage. The wireless line sensor 18 may also contain emergency batteries to provide energy when the power line that the wireless line sensor 18 is coupled to (e.g., attached or clamped) does not have sufficient current flow for a long enough time so as to drain the energy storage 39.

Although the amount of energy harvested by the energy harvesting circuitry 38 represents a negligible amount of energy supplied by the electric power distribution system as a whole, by gradually filling the energy storage 39 from energy harvested from the power line, the wireless line sensor 18 may store enough energy to perform numerous tasks. For example, the wireless line sensor 18 may use the energy to operate any suitable sensing circuitry 40, such as voltage measurement circuitry 41 and current measurement circuitry 42. The voltage measurement circuitry 41 may use one or more capacitive elements to estimate voltage on a distribution line. The capacitive elements may step down the voltage on the distribution line to a level that can be measured by a metering circuit of the voltage measurement circuitry 41. The current measurement circuitry 42 may include a coil that may be looped around the distribution line when the wireless line sensor 18 is clamped around it. The current measurement circuitry 42 may measure the resulting electrical current induced in the coil using metering circuitry; the induced current is proportional to the current flowing through the distribution line.

One or more processor(s) 43 may operate in concert with memory 44 to perform a variety of tasks. The memory 44 may represent any suitable article of manufacture that can store instructions executable by the processor 43 and/or data. For example, the memory 44 may include, but is not limited to, hard drives, floppy diskettes, optical disks, compact disc read-only memories (CD-ROMs), digital versatile disc read-only memories (DVD-ROMs), read-only memories (ROMs), random access memories (RAMs), erasable programmable read-only memories (EPROMs), electrically erasable programmable read-only memories (EEPROMs), flash memory, magnetic or optical cards, solid-state memory devices, or other types of machine-readable media suitable for storing electronic and/or processor-executable instructions.

Among other things, the processor 43 may operate according to these instructions to use the electrical measurements obtained by the sensing circuitry 40 to perform load direction calculations. The processor 43 may send these to be wirelessly transmitted using wireless communication circuitry 45 via an antenna 46. The wireless communication circuitry 45 may include any suitable circuitry to communicate with a corresponding wireless communication system of a wireless line sensor collector 20. For example, the wireless communication circuitry 45 may include suitable communication circuitry for wireless communication via a personal area network (PAN), such as Bluetooth or ZigBee, a local area network (LAN) or wireless local area network (WLAN), such as an 802.11x Wi-Fi network, and/or a wide area network (WAN), (e.g., third-generation (3G) cellular, fourth-generation (4G) cellular, universal mobile telecommunication system (UMTS), long term evolution (LTE), long term evolution license assisted access (LTE-LAA), fifth-generation (5G) cellular, and/or 5G New Radio (5G NR) cellular).

In some cases, the wireless line sensor 18 may also contain a separate moisture sensor 47 to detect a level of moisture of the environmental conditions on the wireless line sensor 18. Based on the level of moisture, the wireless line sensor 18 may perform a different method to determine load direction. It should be understood, however, that the separate moisture sensor 47 may not be present in some embodiments. Indeed, as will be discussed below with reference to FIG. 8, the environmental conditions may be inferred through a relationship between the voltage measurements from the voltage measurement circuitry 41 and the current measurements from the current measurement circuitry 42.

Figure 3:
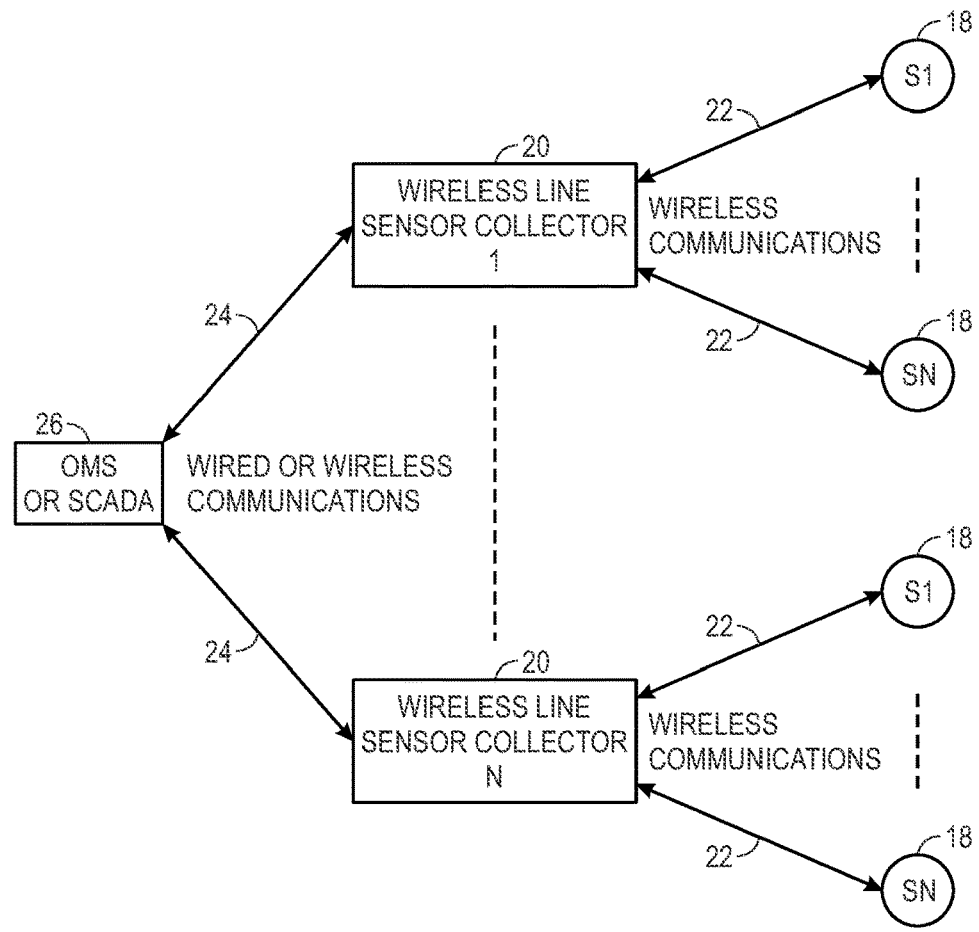
FIG. 3 is a simplified architectural view of communication from wireless line sensors to other components of the electric power distribution system, in accordance with an embodiment.

FIG. 3 is a diagram of the relationship between the Outage Management System (OMS) or Supervisory Control and Data Acquisition (SCADA) system 26, wireless line sensor collectors 20, and wireless line sensors 18. The Outage Management System (OMS) or Supervisory Control and Data Acquisition (SCADA) system 26 may communicate with some number of wireless line sensor collectors 20 using the wired or wireless communication 24. Here, there are shown to be "N" wireless line sensor collectors 20 labeled 1 . . . N. Each wireless line sensor collector 20 may communicate with some number of wireless line sensors 18 via the wireless communication 22. Here, there are also shown to be "N" wireless line sensors 18 labeled S1 . . . SN for each wireless line sensor collector 20. However, the particular number "N" of wireless line sensors 18 may or may not be the same as the number "N" of wireless line sensor collectors 20. Moreover, there may be different number "N" wireless line sensors 18 per each wireless line sensor collector 20.

Figure 4:
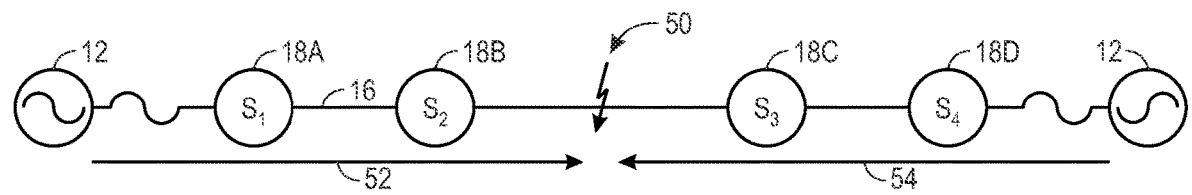
FIG. 4 is a schematic topology of a fault location identifiable as being located between wireless line sensors that identify load direction, in accordance with an embodiment.

Identifying the load direction at each wireless line sensor 18 in a given region of the electric power distribution system 10 may be useful to identify a fault location. For example, as shown in FIG. 4, some number of wireless line sensors 18 may be disposed along a region of a distribution line 16. Because the distribution line 16 is shown to be supplied by generators 12 on both ends of the distribution line 16, the load direction could change depending on the demand from loads across the distribution line 16. Thus, when a fault 50 occurs, the load direction may be determined as being in a first direction 52 by some of the wireless line sensors 18 (in this example, wireless line sensors 18A and 18B). At the same time, the load direction may be determined as being in a second direction 54 by other of the wireless line sensors 18 (in this example, wireless line sensors 18C and 18D). Because the fault 50 may have acted at least briefly as an extreme load, the load direction may suggest the location of the fault. Thus, a fault location may be inferred by identifying a region of the distribution line 16 that receives the load directions from adjacent wireless line sensors 18 (e.g., wireless line sensors 18B and 18C).

Figure 5:
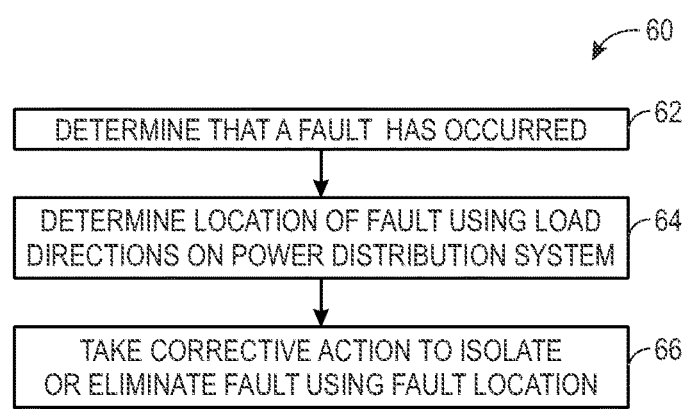
FIG. 5 is a flowchart of a method for isolating and/or eliminating a fault using a fault location, in accordance with an embodiment.

A flowchart 60 of FIG. 5 describes a process for handling a fault on a distribution line. The flowchart 60 begins when a fault is determined to have occurred (block 62). This may represent, for example, identifying that an overcurrent event has occurred. While it may be relatively straightforward to identify that an exceptionally high current has been drawn in an area of an electric power distribution system, it may not be immediately clear exactly where the current was lost. Thus, load direction calculations from wireless line sensors 18 may be used to infer the likely location of the fault (block 64). Thereafter, corrective action may be taken to isolate and/or eliminate the fault at the fault location (block 66). For example, a team may be dispatched to repair a damaged portion of a distribution line or replace damaged equipment.

Figure 6:
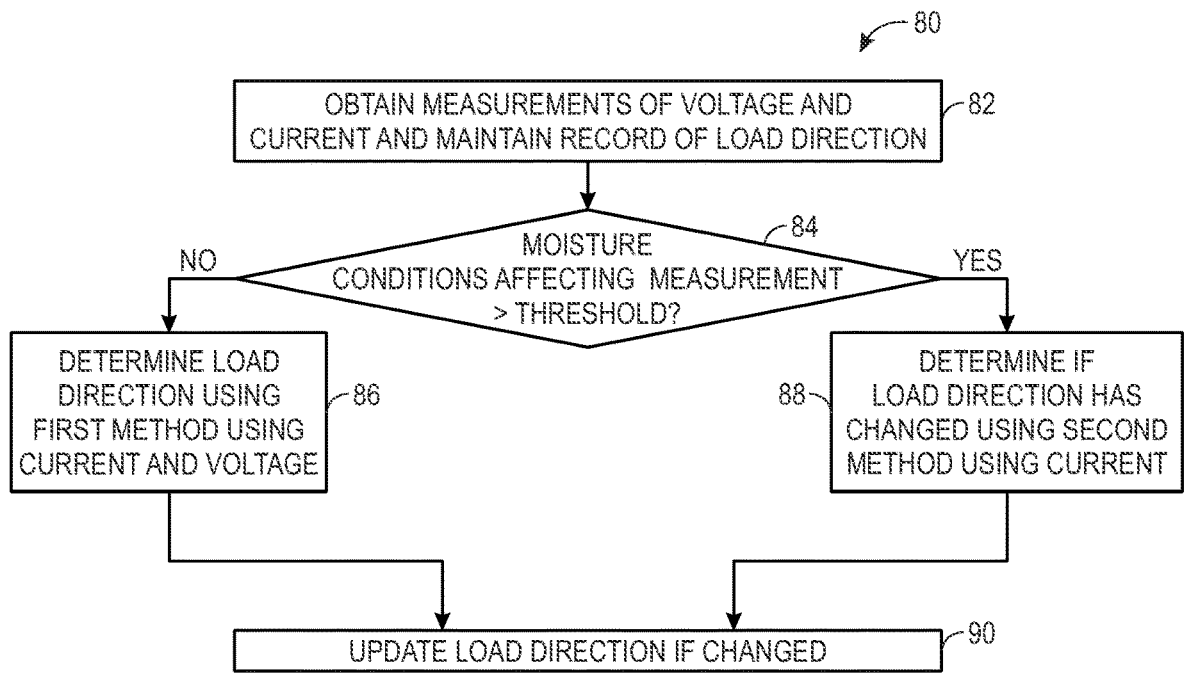
FIG. 6 is a flowchart of a method for determining load direction using different methods for different environmental conditions, namely moisture, in accordance with an embodiment.

Thus, an accurate determination of load direction may be tremendously useful in determining fault location. As shown by a flowchart 80 of FIG. 6, the particular mode in which a wireless line sensor 18 may perform a load determination may vary depending on the environmental conditions. Indeed, the wireless line sensor 18 may obtain measurements of voltage and current on the distribution line (block 82). The wireless line sensor 18 may also maintain a record of the last determined load direction. If moisture remains below a threshold level that would affect voltage measurements by the wireless line sensor 18 (decision block 84), the wireless line sensor 18 may determine load direction in a first mode using a first method that involves both current and voltage measurements (block 86). If moisture exceeds the threshold and therefore would affect voltage measurements by the wireless line sensor 18 (decision block 84), the wireless line sensor 18 may determine a load direction change—but not necessarily the load direction directly—in a second mode using a second method that involves current but not voltage measurements (block 88). In either instance, the record of the load direction maintained by the wireless line sensor 18 may be updated if the load direction has changed (block 90).

Figure 7:
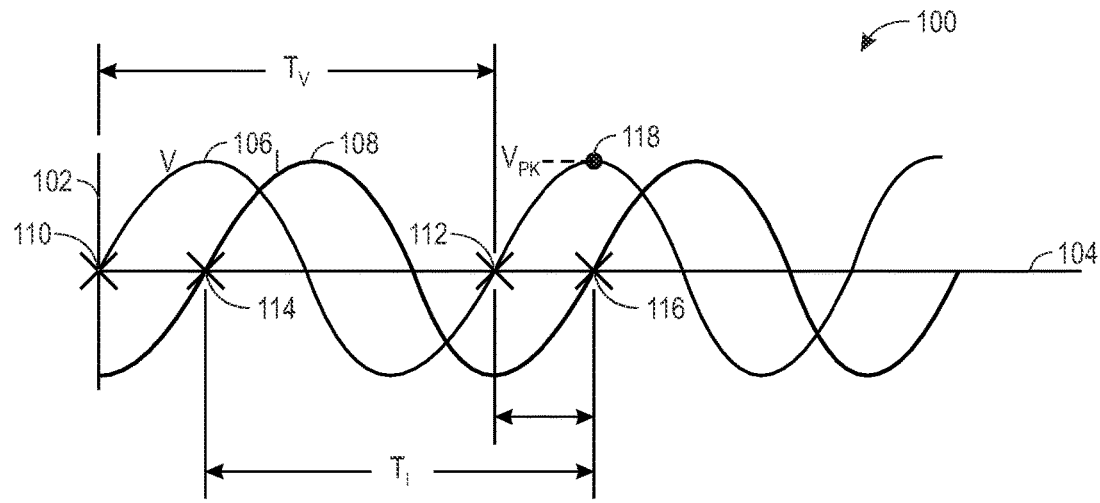
FIG. 7 is a plot of electrical current and voltage measurements of an electrical waveform, in accordance with an embodiment.

FIG. 7 is a plot 100 that represents example measurements of voltage and current on a distribution line with respect to time. A vertical axis 102 represents a magnitude of voltage and current and a horizontal axis 104 represents time. A curve 106 represents voltage over time and a curve 108 represents current over time. Zero crossings 110 and 112 define a voltage period $T_v$ of the curve 106. Zero crossings 114 and 116 define a current period $T_I$ of the curve 108. A point 118 represents a peak voltage $V_{PK}$.

Figure 8:
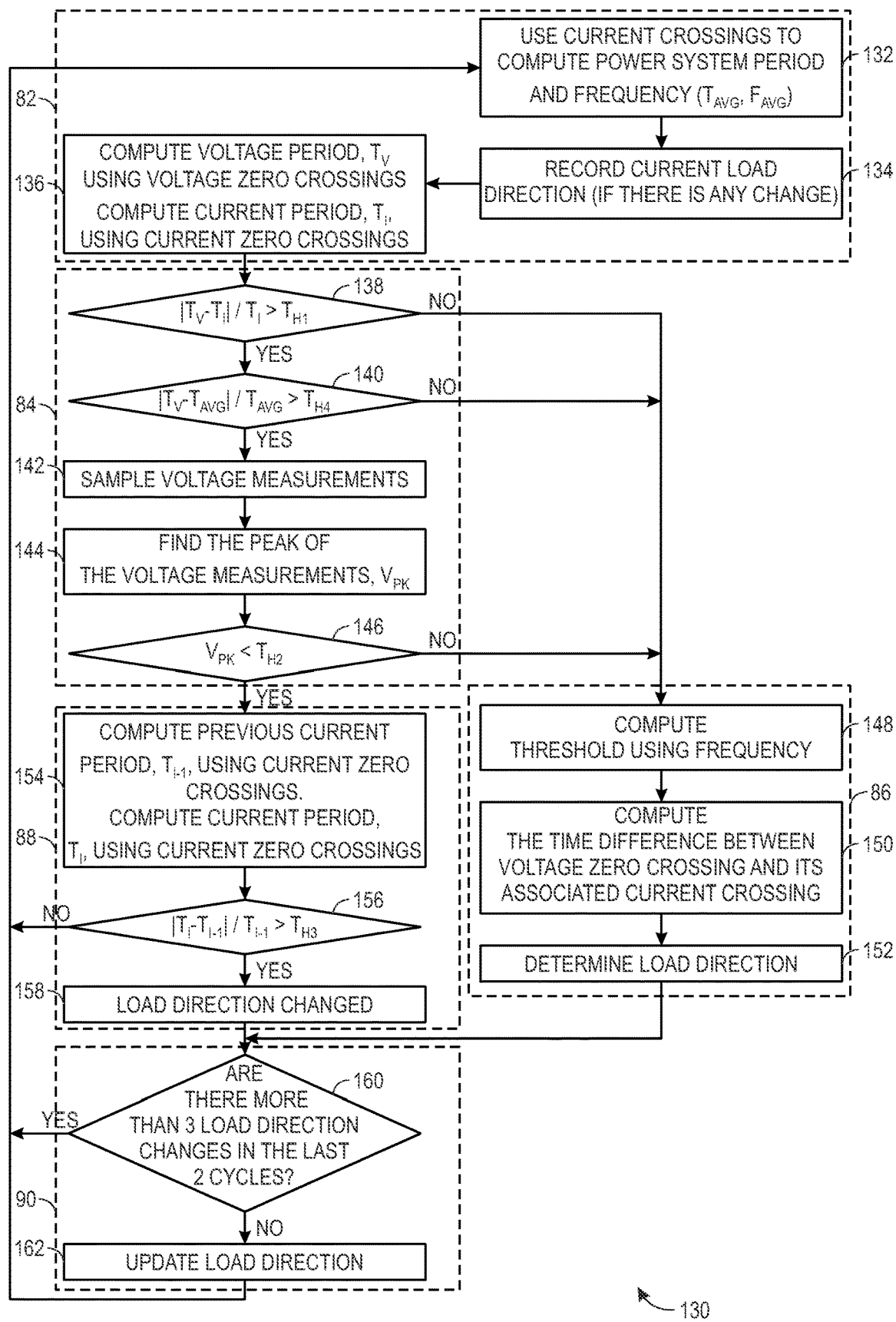
FIG. 8 is a flowchart of a method for determining load direction in different environmental conditions using the electrical current and voltage measurements, in accordance with an embodiment.

FIG. 8 is a flowchart 130 of a process to determine and/or update a load direction using electrical measurements such as those illustrated in FIG. 7. The process of the flowchart 130 may be carried out by a wireless line sensor 18, a wireless line sensor collector 20, or an Outage Management System (OMS) or Supervisory Control and Data Acquisition (SCADA) system 26, or some combination of these working in concert. Blocks 132, 134, and 136 of FIG. 8 generally correspond to block 82 of the flowchart 80 of FIG. 6; blocks 138, 140, 142, 144, and 146 of FIG. 8 generally correspond to block 84 of the flowchart 80 of FIG. 6; blocks 148, 150, and 152 of FIG. 8 generally correspond to block 86 of the flowchart 80 of FIG. 6; blocks 154, 156, and 158 of FIG. 8 generally correspond to block 88 of the flowchart 80 of FIG. 6; and blocks 160 and 162 of FIG. 8 generally correspond to block 90 of the flowchart 80 of FIG. 6.

The flowchart 130 of FIG. 8 may begin as the measured electrical current zero crossings are used to compute an average power system period $T_{AVG}$ and an average frequency $F_{AVG}$ (block 132). The present load direction may also be recorded, to the extent there has been a recent change (block 134). The voltage period $T_v$ may be computed using the voltage zero crossings and the current period $T_i$ may be computed using the electrical current zero crossings (block 136).

Blocks 138, 140, 142, and 144 relate to one manner of identifying whether environmental conditions at a wireless line sensor are affecting its voltage measurements. Using data obtained in block 136, a percent error of the voltage and current periods may be compared to a first percent error threshold $T_{H1}$ (decision block 138). The first percent error threshold $T_{H1}$ may vary depending on the voltage measurement circuitry 41 of the wireless line sensors 18, the shape and manner of contact with the distribution line, and/or other considerations. As such, the percent error threshold $T_{H1}$ may be determined empirically or through computer modeling. If the percent error calculation is less than the first percent error threshold $T_{H1}$ (decision block 138), the voltage measurements may be understood not likely to be affected by moisture. As such, the flowchart may proceed to section 86.

On the other hand, if the percent error calculation is greater than the percent error threshold $T_{H1}$ (decision block 138), this suggests that moisture could be affecting the voltage measurements. In this case, a percent error of the voltage period $T_v$ and the power system average period $T_{avg}$ may be compared against a second percent error threshold $T_{H4}$ (decision block 140). The second percent error threshold $T_{H4}$ may also vary depending on the voltage measurement circuitry 41 of the wireless line sensors 18, the shape and manner of contact with the distribution line, and/or other considerations. As such, the second percent error threshold $T_{H4}$ may also be determined empirically or through computer modeling. If the second percent error calculated at block 140 is less than the second percent error threshold $T_{H4}$ (decision block 140), this also suggests that the voltage measurement is not presently affected by moisture. As such, the flowchart may proceed to section 86.

On the other hand, if the second percent error is greater than the second percent error threshold $T_{H4}$ (decision block 140), this suggests that moisture could be affecting the voltage measurements. Thus, the voltage measurements may be sampled (block 142) to identify a peak voltage magnitude $V_{pk}$ (block 144). If the peak voltage magnitude $V_{pk}$ is greater than a peak threshold voltage $T_{H2}$ (decision block 146), this suggests that, even if the wireless line sensor 18 is presently under high-moisture environmental conditions, the magnitude of the voltage is high enough not to be substantially affected for purposes of identifying load direction. In that case, the flowchart may proceed to section 86. The peak threshold voltage $T_{H2}$ may also be determined empirically or through computer modeling.

The blocks 148, 150, and 152 of section 86 relate to determining load direction when the voltage measurements are not substantially impacted by environmental conditions. Several thresholds TD1, TD2, TD3, and TD4 may be computed using average frequency $F_{AVG}$ (block 148). These thresholds may be computed as follows:

$TD1=90/F_{AVG}/360$ $TD2=270/F_{AVG}/360$ $TD3=1/F_{AVG}$ $TD4=180/F_{AVG}/360$

A time difference may be computed between a voltage zero crossing and an associate current zero crossing (block 150). Recalling the example of FIG. 7, this may be represented as the time difference between the voltage zero crossing 114 ($t_v$) and the current zero crossing 116 ($t_i$). When a time difference between the voltage zero crossing $t_v$ and the current zero crossing $t_i$ (i.e., $t_v-t_i$) is between 0 and TD1, the load direction may be forward and the voltage may lag the current. When a time difference between the voltage zero crossing $t_v$ and the current zero crossing $t_i$ (i.e., $t_v-t_i$) is between TD4 and TD1, the load direction may be reverse and voltage may lead the current. When a time difference between the voltage zero crossing $t_v$ and the current zero crossing $t_i$ (i.e., $t_v-t_i$) is between TD2 and TD4, the load direction may be reverse and voltage may lag the current. When a time difference between the voltage zero crossing $t_v$ and the current zero crossing $t_i$ (i.e., $t_v-t_i$) is between TD3 and TD2, the load direction may be forward and the voltage may lead the current. In this way, the load direction may be determined when the environmental conditions at the wireless line sensor 18 are not substantially affecting voltage measurements (block 152).

Returning to reconsider the decision block 146, in some cases, the peak voltage magnitude $V_{pk}$ may not greater than a peak threshold voltage $T_{H2}$. This suggests that the wireless line sensor 18 is presently under high-moisture environmental conditions and the magnitude of the voltage is low enough to be substantially affected by the moisture. As such, the flowchart may proceed to section 88 to determine whether load direction has changed without using the voltage measurement. A previous current period $T_{i-1}$ and a present current period $T_i$ may be computed using current zero crossings to determine the period (block 154). If a percent error between the previous current period $T_{i-1}$ and the present current period $T_i$ remains within a third percent error threshold $T_{H3}$, the load direction may be understood not to have changed (decision block 156), and the process may return to section 82. Before continuing, it should be appreciated that the third percent error threshold $T_{H3}$ may also be determined empirically or through computer modeling.

On the other hand, if the percent error between the previous current period $T_{i-1}$ and the present current period $T_i$ is greater than the third percent error threshold $T_{H3}$, the load direction may be understood to have changed (decision block 156). In that case, the process may continue to section 90. To increase confidence that this is a genuine load direction change, the number of recently calculated load direction changes may be observed. If there are more than some threshold number (e.g., 3, 4, 5) of load direction changes within the last two cycles (decision block 160), this may suggest that the calculated load direction change is not actually a load direction change. As such, the load direction may not be updated, and the process may return to section 82. If there are not more than the threshold number of load direction changes within the last two cycles (decision block 160), this may suggest that the calculated load direction change is a load direction change. In that case, the load direction may be updated 162.

While specific embodiments and applications of the disclosure have been illustrated and described, it is to be understood that the disclosure is not limited to the precise configurations and components disclosed herein. For example, the systems, devices, and instructions described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure I to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . ", it is intended that such elements are to be interpreted under 35 U.S.C. 112(f). For any claims containing elements designated in any other manner, however, it is intended that such element are not to be interpreted under 35 U.S.C. 112(f).

What is claimed is:

1. A system for calculating a present load direction of an electrical waveform on a transmission line of an electric power distribution system, the system comprising:
   sensing circuitry configured to sense a first parameter and a second parameter of the electrical waveform on the transmission line of the electric power distribution system; and
   processing circuitry configured to determine the present load direction of the electrical waveform using a first method based at least in part on the first parameter in response to detecting that the sensing circuitry is experiencing a first environmental condition and determine the present load direction of the electrical waveform using a second method based at least in part on the second parameter and not the first parameter in response to detecting that the sensing circuitry is experiencing a second environmental condition;
   wherein:
      the first method comprises determining the present load direction irrespective of a historical load direction; and
      the second method comprises determining a load direction change and using the load direction change and the historical load direction to determine the present load direction.

2. The system of claim 1, wherein the first parameter comprises a voltage measurement of a voltage component of the electrical waveform and the second parameter comprises a current measurement of a current component of the electrical waveform.

3. The system of claim 2, wherein the first method comprises using both the first parameter and the second parameter and wherein the second method comprises using the second parameter but not the first parameter.

4. The system of claim 2, wherein the voltage measurement comprises a voltage period, wherein the processing circuitry is configured to identify whether the sensing circuitry is experiencing the first environmental condition or whether the sensing circuitry is experiencing the second environmental condition based at least in part on the voltage period.

5. The system of claim 1, wherein the first method is based at least in part on the first parameter and the second parameter.

6. The system of claim 1, comprising a memory device configured to store:
   a record of a historical load direction; and
   instructions that, when executed by the processing circuitry, cause the processing circuitry to determine the present load direction based at least in part on the stored historical load direction.

7. The system of claim 1, comprising a moisture sensor configured to detect whether the sensing circuitry is experiencing the first environmental condition or the second environmental condition.

8. The system of claim 1, comprising an outage management system (OMS) or a supervisory control and data acquisition (SCADA) system configured to use the present load direction to isolate a fault location on the transmission line.

9. The system of claim 1, wherein the processing circuitry is disposed in:
   a wireless line sensor configured to attached to the transmission line; or
   a wireless line sensor collector configured to be in wireless communication with a plurality of wireless line sensors; or
   a combination thereof.

10. A system for calculating a present load direction of an electrical waveform on a transmission line of an electric power distribution system, the system comprising:
    sensing circuitry configured to sense a first parameter and a second parameter of the electrical waveform on the transmission line of the electric power distribution system;
    a moisture sensor configured to detect whether the sensing circuitry is experiencing a first environmental condition or a second environmental condition and
    processing circuitry configured to determine the present load direction of the electrical waveform using a first method based at least in part on the first parameter in response to detecting that the sensing circuitry is experiencing the first environmental condition and determine the present load direction of the electrical waveform using a second method based at least in part on the second parameter and not the first parameter in response to detecting that the sensing circuitry is experiencing the second environmental condition.

* * * * *